(12) United States Patent
Kim et al.

(10) Patent No.: US 8,093,703 B2
(45) Date of Patent: Jan. 10, 2012

(54) SEMICONDUCTOR PACKAGE HAVING BURIED POST IN ENCAPSULANT AND METHOD OF MANUFACTURING THE SAME

(75) Inventors: Pyoung-Wan Kim, Gyeonggi-do (KR); Teak-Hoon Lee, Gyeonggi-do (KR); Chul-Yong Jang, Busan-si (KR)

(73) Assignee: Samsung Electronics Co., Ltd., Maetan-dong, Yeongtong-gu, Suwon-si, Gyeonggi-do (KR)

(*) Notice: Subject to any disclaimer, the term of this patent is extended or adjusted under 35 U.S.C. 154(b) by 748 days.

(21) Appl. No.: 12/104,333

(22) Filed: Apr. 16, 2008

(65) Prior Publication Data
US 2009/0039491 A1    Feb. 12, 2009

(30) Foreign Application Priority Data

Aug. 10, 2007 (KR) .................. 10-2007-0080595

(51) Int. Cl.
*H01L 23/00* (2006.01)
(52) U.S. Cl. ................. 257/686; 257/E23.001; 438/109
(58) Field of Classification Search .................. 257/686, 257/E23.001
See application file for complete search history.

(56) References Cited

U.S. PATENT DOCUMENTS

| 6,365,513 | B1 | 4/2002 | Furukawa et al. | |
| 6,451,624 | B1* | 9/2002 | Farnworth et al. | 438/106 |
| 6,489,676 | B2 | 12/2002 | Taniguchi et al. | |
| 6,770,971 | B2 | 8/2004 | Kouno et al. | |
| 6,911,392 | B2 | 6/2005 | Bieck et al. | |
| 6,982,487 | B2 | 1/2006 | Kim et al. | |
| 7,071,098 | B2 | 7/2006 | Kirby et al. | |
| 7,215,033 | B2* | 5/2007 | Lee et al. | 257/777 |
| 7,511,371 | B2* | 3/2009 | Wallace | 257/692 |
| 7,525,186 | B2* | 4/2009 | Kim et al. | 257/686 |
| 7,763,498 | B2* | 7/2010 | Kim | 438/113 |
| 2008/0001276 | A1* | 1/2008 | Lee et al. | 257/686 |

FOREIGN PATENT DOCUMENTS

| CN | 1453841 A | 11/2003 |
| CN | 1532924 A | 9/2004 |
| CN | 1929120 A | 3/2007 |
| CN | 101330068 A | 12/2008 |
| JP | 2005-12089 | 1/2005 |

OTHER PUBLICATIONS

English language abstract of Japanese Publication No. 2005-12089.

* cited by examiner

*Primary Examiner* — Benjamin Sandvik
*Assistant Examiner* — Krista Soderholm
(74) *Attorney, Agent, or Firm* — Muir Patent Consulting, PLLC

(57) ABSTRACT

In one embodiment, a semiconductor package includes a first insulating body and a first semiconductor chip having a first active surface and a first back surface opposite the first active surface. The first semiconductor chip is disposed within the first insulating body. The first active surface is exposed by the first insulating body. The first back surface is substantially surrounded by the first insulating body. The semiconductor package includes a post within the first insulating body and adjacent to a side of the first semiconductor chip.

46 Claims, 11 Drawing Sheets

SEMICONDUCTOR PACKAGE HAVING BURIED POST IN ENCAPSULANT AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 2007-0080595 filed on Aug. 10, 2007, the entire contents of which are hereby incorporated by reference.

BACKGROUND

1. Field of Invention

Embodiments exemplarily described herein generally relate to semiconductor packages and methods of manufacturing the same. More particularly, embodiments exemplarily described herein relate to semiconductor packages having increased adhesive strength between the components within the semiconductor packages such as an encapsulation material, redistribution patterns and/or a dielectric material, and to methods of manufacturing the same. Other embodiments exemplarily described herein relate to semiconductor packages having increased interconnection characteristics and reliability, and to methods of manufacturing the same.

2. Description of the Related Art

In the semiconductor industry, integrated circuit (IC) packaging technologies continue to develop to meet the demand for scaling down of size, high density and improved mounting reliability.

Package stacking technology and chip stacking technology are examples of such IC packaging technologies. In the package stacking technology, semiconductor packages typically are stacked using solder balls. In the chip stacking technology, semiconductor chips are typically stacked using plugs formed through the semiconductor chips.

In particular, the semiconductor chip typically includes a plurality of pad areas disposed on an active surface thereof. The solder balls are generally connected to the pad areas. However, following the decrease in design rules, the need for high pin count packages, and a smaller pad pitch, according to recent trends in the electronics industry, it can be difficult to ensure that adjacent solder balls do not contact each other.

Consequently, fan-out type semiconductor packages have been developed. A typical fan-out type semiconductor package includes a plurality of redistribution patterns formed over the active surface of the semiconductor chip that electrically redistribute the locations of the pad areas on the active surface of the semiconductor chip to regions outside an area defined by the active surface of the semiconductor chip.

In a typical fan-out type semiconductor package, the redistribution patterns are arranged over the active area of the semiconductor chip and are attached to the encapsulation material that encapsulates the semiconductor chip. The redistribution patterns can be formed by, for example, forming an interlevel dielectric (ILD) over the encapsulation material. Then, the ILD is patterned to form a groove therein. Next, a conductive material is formed over the resulting structure and within the groove to form the redistribution patterns.

However, the ILD is susceptible to delamination from the encapsulation material because the ILD is typically very thin and as a result, the interface between the encapsulation material and the ILD can be vulnerable to physical impacts or moisture or stress. Furthermore, for the same reason, the redistribution patterns can also be susceptible to delamination from the encapsulation material.

In addition, multi-chip packages (i.e., semiconductor packages incorporating a plurality of stacked semiconductor chips or packages) can be formed by patterning encapsulation material to create an opening enabling electrical connections to external terminals. The encapsulation material can be patterned via a laser drilling process using an infrared (IR) laser. IR lasers have a relatively long wavelength. Accordingly, light emitted by IR lasers during the laser drilling process is scattered as it passes through the encapsulation material. As a result, sidewalls of the opening in the encapsulation material can become damaged which, in turn, leads to poor adhesion between a subsequently formed conductive pattern therein and the encapsulation material.

These and other problems are addressed by the embodiments of the present invention exemplarily described herein.

SUMMARY

One embodiment of the present invention can be exemplarily characterized as a semiconductor package that includes a first insulating body; a first semiconductor chip having a first active surface and a first back surface opposite the first active surface, the first semiconductor chip disposed within the first insulating body, the first active surface exposed by the first insulating body, the first back surface substantially surrounded by the first insulating body; and a post disposed within the first insulating body and adjacent to a side of the first semiconductor chip.

BRIEF DESCRIPTION OF THE DRAWINGS

Hereinafter, embodiments of the present invention will be described with reference to the accompanying drawings, in which.

DETAILED DESCRIPTION

Figure 1A:
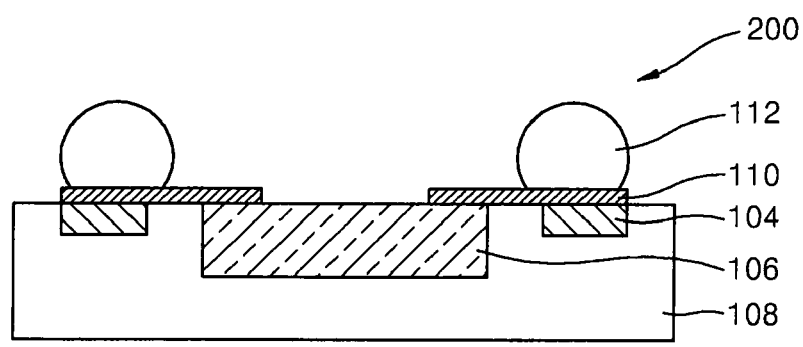
FIG. 1A is a cross-sectional view of a first embodiment of a semiconductor package.

Exemplary embodiments of the present invention will now be described more fully hereinafter with reference to the accompanying drawings. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 1B:
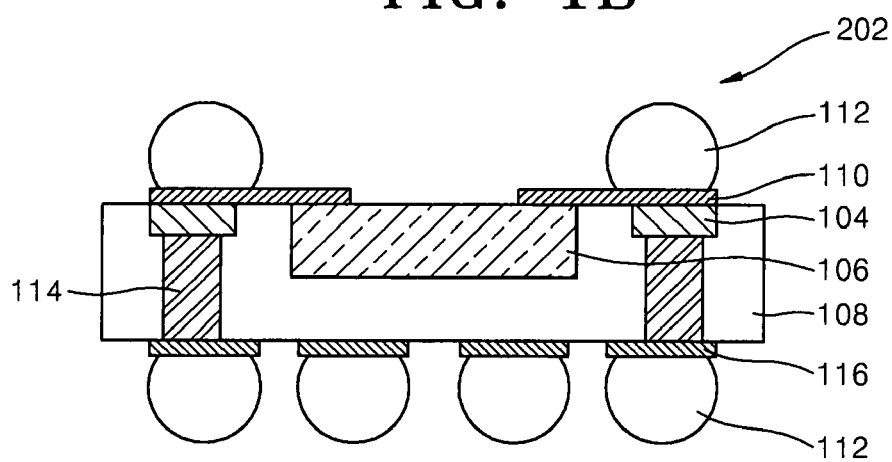
FIG. 1B is a cross-sectional view of a semiconductor package according to a variation of the first embodiment.

FIG. 1A is a cross-sectional view of a first embodiment of a semiconductor package. FIG. 1B is a cross-sectional view of a semiconductor package according to a variation of the first embodiment.

Referring to FIG. 1A, a semiconductor package 200 may, for example, include posts 104, a semiconductor chip 106 (also referred to herein as a "first semiconductor chip 106"), an insulating body 108 (also referred to herein as a "first insulating body 108"), conductive patterns 110 (also referred to herein as a "first conductive patterns 110" or first redistribution patterns) and external terminals 112. As illustrated, the semiconductor package 200 is a fan-out type semiconductor package. It will be appreciated, however, that the semiconductor package 200 may also be provided as a fan-in/out type semiconductor package (i.e., a semiconductor package in which additional terminals (not shown) are located directly over the semiconductor chip 106) or be provided as a fan in type semiconductor package (i.e., a semiconductor package in which the external terminals 112 are located directly over the semiconductor chip 106) if the semiconductor package 200 is incorporated in a multi-chip package.

In one embodiment, the insulating body 108 may include an encapsulation material such as an epoxy resin or other suitable encapsulation material known to one skilled in the art. The insulating body 108 may be characterized as having an upper surface and a lower surface opposite the upper surface.

In one embodiment, the semiconductor chip 106 may be characterized as having an active surface (also referred to herein as a "first active surface"), a back surface (also referred to herein as a "first back surface") opposite the active surface, and peripheral surfaces or side surfaces connecting the active surface and the back surface. The semiconductor chip 106 may be disposed within the insulating body 108 such that the active surface is exposed by the insulating body 108. In one embodiment, the active surface of the semiconductor chip 106 may be substantially coplanar with the upper surface of the insulating body 108.

In one embodiment, the back surface of the semiconductor chip 106 may be substantially surrounded by the insulating body 108. In another embodiment, the back surface and the side surfaces of the semiconductor chip 106 may be substantially surrounded by the insulating body 108.

In one embodiment, the posts 104 may include an electrically conductive material (e.g., Cu, Fe, Ag, Au, Al, a conductive polymer, or the like or a combination thereof). In another embodiment, substantially all of the posts 104 may be composed of electrically conductive material. In one embodiment, the posts 104 may include an electrically insulative material (e.g., a dielectric material). In another embodiment, substantially all of the posts 104 may be composed of electrically insulative material.

The posts 104 may be disposed within the insulating body 108 at a location adjacent to sides of the semiconductor chip 106. Each post 104 may be characterized as having a top surface, a bottom surface and a side surface connecting the top surface and the bottom surface. In one embodiment, the top surface of each post 104 may be exposed by the insulating body 108 and the bottom surface of each post 104 may be located at a region that is intermediate between the active surface and the back surface of the semiconductor chip 106.

The post 104 may be characterized as having a thickness (i.e., the distance between the top surface and the bottom surface thereof) and a width (i.e., the distance between adjacent side surfaces). In one embodiment, the thickness of each post 104 may be smaller than the width thereof.

In one embodiment, the insulating body 108 may surround the bottom surface of each post 104. In another embodiment, the insulating body 108 may surround the bottom surface and the side surface of each post 104. In this case, the post 104 does not extend through the insulating body 108. In other words, the bottom surface of the post 104 is intermediate between the first active surface and the first back surface of the semiconductor chip 106.

In one embodiment, the conductive patterns 110 may be disposed on the insulating body 108 and on the top surface of the post 104. The conductive patterns 110 may be connected (e.g., electrically connected) to the semiconductor chip 106. In one embodiment, a bottom surface of the conductive pattern 110 may be characterized as being within substantially the same plane as the active surface of the semiconductor chip 106. Accordingly, the bottom surface of the conductive pattern 110 may directly contact at least a portion of the active surface of the semiconductor chip 106. Although not shown in FIG. 1A, a patterned insulating layer (see, e.g., first patterned insulating layer 144C in FIGS. 5A-5D and 6A-6C) may be interposed between the conductive patterns 110 and the insulating body 108.

In one embodiment, each of the conductive patterns 110 may be characterized as extending straight from the edge of the active surface of the semiconductor chip 106 to corresponding ones of the posts 104 (e.g., to top surfaces of corresponding ones of the posts 104). In another embodiment, the lower surfaces of each of the conductive patterns 110 may be connected (e.g., directly connected) to corresponding ones of the posts 104.

In one embodiment, the posts 104 and the conductive patterns 110 can be an integral body. In another embodiment, the posts 104 and the conductive patterns 110 can be separate bodies. Accordingly, the posts 104 and the conductive patterns 110 may include the same material or substantially the same material. Alternatively, the posts 104 and the conductive patterns 110 may include different materials.

In one embodiment, the external terminals 112 may be provided as conductive bumps or conductive balls such as solder balls connected (e.g., electrically connected) to corresponding ones of the conductive patterns 110. In one embodiment, the external terminals 112 may be connected to upper surfaces (or a portions thereof) of corresponding ones of the conductive patterns 110.

As exemplarily illustrated, each of the external terminals 112 is disposed above the posts 104. In one embodiment, each of the external terminals 112 may be in vertical alignment with corresponding ones of the posts 104. Accordingly, the external terminals 112 and posts 104 are arranged such that at least a portion of each external terminal 112 and at least a portion of a corresponding post 104 are is disposed within substantially the same vertical plane. Accordingly, the external terminals 112 can, in one embodiment, be characterized as being located directly above corresponding one of the posts 104. Similarly, the external terminal 112 can, in another embodiment, be characterized as being connected to a portion of the upper surface of a conductive pattern 110 that is directly opposite the portion of the lower surface of the conductive pattern 110 that is connected to a post 104.

Figure 5A:
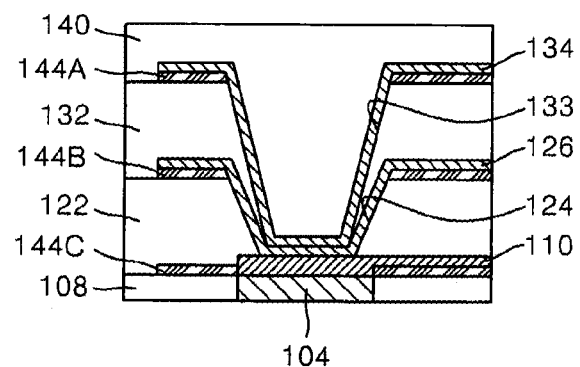
FIGS. 5A-5D are enlarged cross-sectional views of the structure disposed in region "A" of the semiconductor package shown in FIG. 4A, according to some embodiments.
Figure 5B:
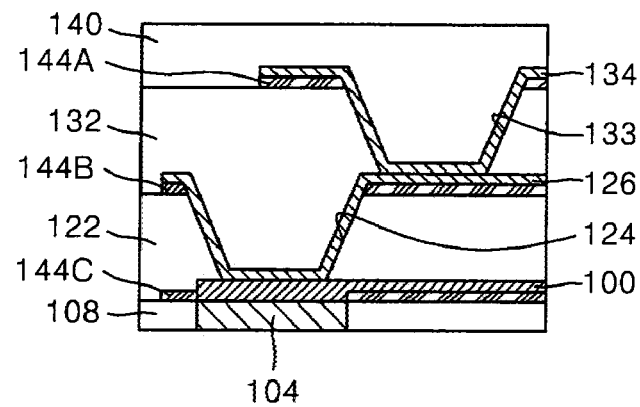

As described above in the Description of the Related Art, the conductive patterns 110 or the redistribution patterns can be formed by, for example, forming a patterned insulating layer or a patterned interlevel dielectric (ILD) having a groove, for example, 144C of FIG. 5B, over the first insulating body 108, e.g., an encapsulation material. Next, a conductive material is formed over the resulting structure and within the groove to form the conductive patterns 110, e.g., redistribution patterns. However, the ILD or the conductive patterns 110 are susceptible to delamination from the insulating body 108 because the interface between the insulating body 108 and the ILD or the conductive patterns 110 are vulnerable to physical impacts or moisture or stress.

The posts 104 in the semiconductor package 200, however, have a greater adhesion with the aforementioned patterned insulating layer, e.g., 144C of FIG. 5B, and the first insulating body 108 than the aforementioned patterned insulating layer has with the first insulating body 108 due to the wider contact area between the post 104 and the insulating body 108 compared to the structure described in the Description of the Related Art. Moreover, the conductive patterns 110 can be securely bonded to the posts 104.

Therefore, problems associated with delamination between the insulating body 108 and the aforementioned patterned insulating layer can either be eliminated or significantly reduced. As a result, the reliability of the semiconductor package 200 can be increased relative to conventional semiconductor packages.

Referring to FIG. 1B, a semiconductor package 202 may be provided as similarly described above with respect to the semiconductor package 200 shown in FIG. 1A, but may further include through vias 114 and auxiliary wiring patterns 116.

As exemplarily illustrated, the through vias 114 extend through the insulating body 108 such that an upper portion of each through via 114 contacts a portion of a corresponding one of the posts 104 (e.g., the bottom surface of a corresponding one of the posts 104) and such that a lower portion of each through via 114 is exposed by the lower surface of the insulating body 108.

In one embodiment, the through vias 114 include a conductive material. In another embodiment, the auxiliary wiring patterns 116 include a conductive material. External terminals 112 may also be electrically connected to corresponding ones of the auxiliary wiring patterns 116. Accordingly, in some embodiments, the structure of a through-chip via 114 (e.g., through-silicon via) contacting a post 104 may electrically connect a conductive pattern 110 with an auxiliary wiring pattern 116. As a result, the external terminals 112 on opposite sides of the semiconductor package 202 may be electrically connected to each other. Constructed as exemplarily described above, the semiconductor package 202 may be characterized as a package-on-package type (POP-type) semiconductor package.

Figure 2A:
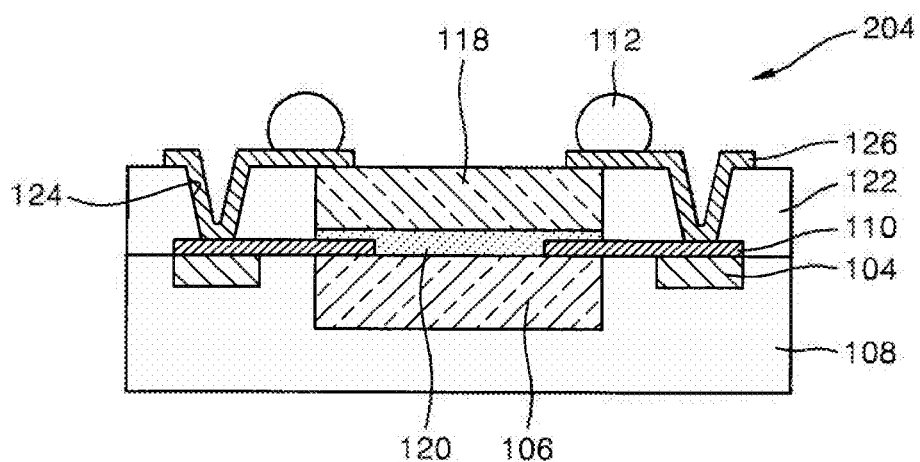
FIG. 2A is a cross-sectional view of a second embodiment of a semiconductor package.
Figure 2B:
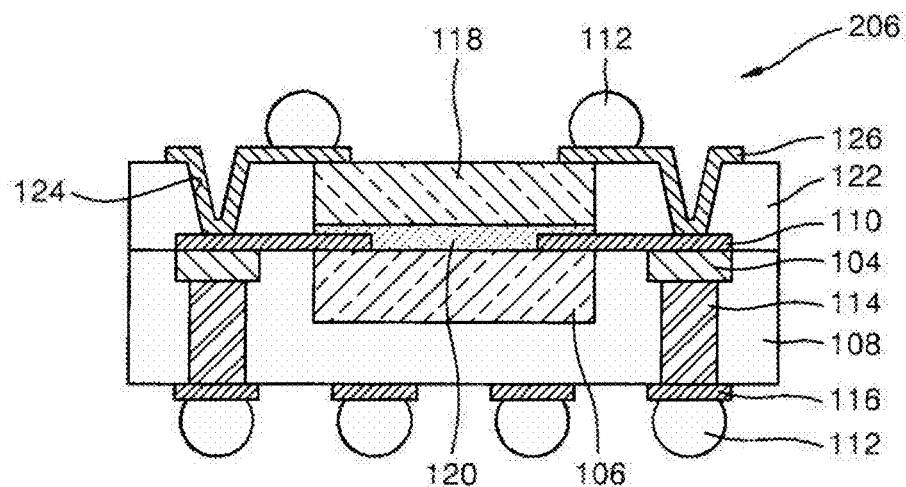
FIG. 2B is a cross-sectional view of a semiconductor package according to a variation of the second embodiment.

FIG. 2A is a cross-sectional view of a second embodiment of a semiconductor package. FIG. 2B is a cross-sectional view of a semiconductor package according to a variation of the second embodiment.

Referring to FIG. 2A, a semiconductor package 204 may be provided as similarly described above with respect to the semiconductor package 200 shown in FIG. 1A, but may further include a semiconductor chip 118 (also referred to herein as a "second semiconductor chip 118"), an adhesion layer 120 (also referred to herein as a "first adhesion layer 120"), an insulating body 122 (also referred to herein as a "second insulating body 122") and conductive patterns 126 (also referred to herein as "second conductive patterns 126" or second redistribution patterns).

In one embodiment, the second insulating body 122 is disposed over the first insulating body 108. The second insulating body 122 may include an encapsulation material. The second insulating body 122 may further include first cavities 124 extending from an upper surface thereof to a lower surface thereof. In one embodiment, a location of each of the first cavities 124 within the second insulating body 122 substantially corresponds to a location of corresponding ones of the posts 104 within the first insulating body 108. Accordingly, the first cavities 124 may be disposed at locations directly above corresponding ones of the posts 104.

In one embodiment, the second semiconductor chip 118 is disposed over the first semiconductor chip 106. In another embodiment, the second semiconductor chip 118 may be disposed within the second insulating body 122. A portion of the second semiconductor chip 118 may be exposed by a lower surface of the second insulating body 122. In one embodiment, the second semiconductor chip 118 is substantially the same size as the first semiconductor chip 106. It will be appreciated, however, that the second semiconductor chip 118 may be smaller or larger than the first semiconductor chip 106.

In some embodiments, the second conductive pattern 126 is electrically connected to the second semiconductor chip 118 and the first conductive pattern 110. In another embodiment, corresponding ones of the second conductive patterns 126 and corresponding ones of the first conductive patterns 110 are electrically connected to each other through corresponding ones of first cavities 124.

In one embodiment, the adhesion layer 120 (e.g., an adhesive) is disposed between the first semiconductor chip 106 and the second semiconductor chip 118 to adhere the first semiconductor chip 106 to the second semiconductor chip 118. As exemplarily illustrated, the adhesion layer 120 may also be disposed between the second semiconductor chip 118 and the conductive patterns 110.

Referring to FIG. 2B, a semiconductor package 206 may be provided as similarly described above with respect to the semiconductor package 204 shown in FIG. 2A, but may further include through vias 114 and auxiliary wiring patterns 116 as previously described with respect to FIG. 1B.

Figure 3:
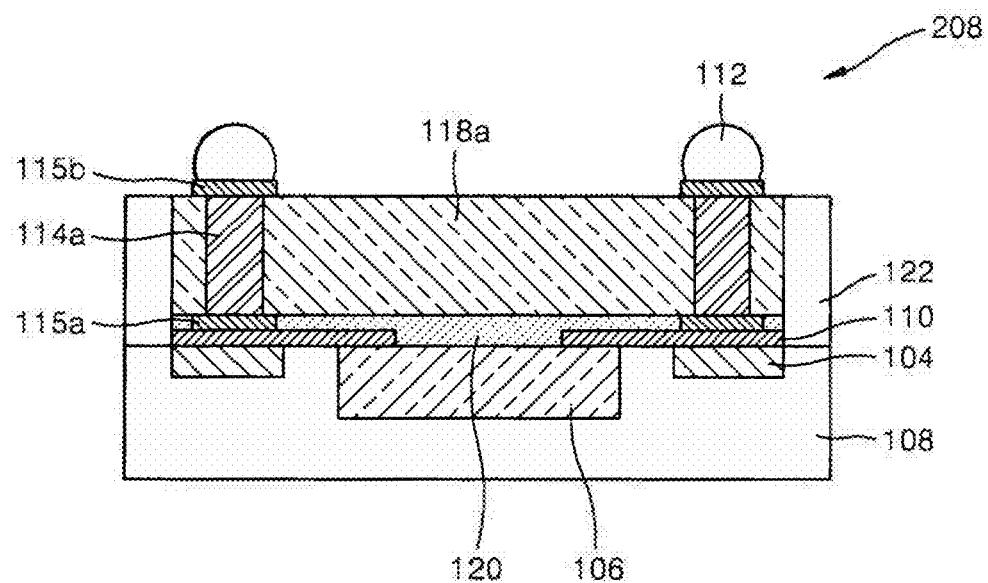
FIG. 3 is a cross-sectional view of a third embodiment of a semiconductor package.

FIG. 3 is a cross-sectional view of a third embodiment of a semiconductor package.

Referring to FIG. 3, a semiconductor package 208 may be provided as similarly described above with respect to the semiconductor package 204 shown in FIG. 2A, but may include a semiconductor chip 118a (also referred to herein as a "second semiconductor chip 118a"), through-chip vias 114a (also referred to herein as "second conductive patterns 114a"), first chip pads 115a, second chip pads 115b, an adhesion layer 120 (also referred to herein as a "first adhesion layer 120"), an insulating body 122 (also referred to herein as a "second insulating body 122") and conductive patterns 110 (also referred to herein as "first conductive patterns 110" or first redistribution patterns).

In one embodiment, the second insulating body 122 is disposed over the first insulating body 108. The second insulating body 122 may include an encapsulation material such as an epoxy resin known to one skilled in the art.

In one embodiment, the second semiconductor chip 118a is disposed over the first semiconductor chip 106. In another embodiment, the second semiconductor chip 118a may be disposed within the second insulating body 122. A portion of the second semiconductor chip 118a may be exposed by a lower surface of the second insulating body 122. In one embodiment, the second semiconductor chip 118 is larger than the first semiconductor chip 106.

In another embodiment, the second semiconductor chip 118 may be characterized as having an active surface (also referred to as a "second active surface") and a back surface (also referred to as a "second back surface") opposite the second active surface. The first chip pads 115a are disposed on the second back surface and second chip pads 115b are disposed on the second active surface.

Alternatively, the surface of the second semiconductor chip 118a that faces the first active surface of the first semiconductor chip 106 may be the second active surface contrary to the above described embodiment. In this case, the first chip pads 115a are disposed on the second active surface and second chip pads 115b are disposed on the second back surface. The first chip pads 115a and the second chip pads 115b may be electrically connected to each other via the through-chip vias 114a.

In one embodiment, a location of each of the through-chip vias 114a within the second insulating body 122 substantially corresponds to locations of corresponding ones of the posts 104 within the first insulating body 108. Accordingly, the through-chip vias 114a may be disposed at locations directly above corresponding ones of the posts 104.

The first conductive patterns 110 may be electrically connected to corresponding ones of the first chip pads 115a and the external terminals 112 may be electrically connected to corresponding ones of the second chip pads 115b.

In one embodiment, the adhesion layer 120 (e.g., an adhesive) is disposed between the first semiconductor chip 106 and the second semiconductor chip 118a to adhere the first semiconductor chip 106 to the second semiconductor chip 118a. As exemplarily illustrated, the adhesion layer 120 may also be disposed between the second semiconductor chip 118a and the conductive patterns 110.

In one embodiment, the adhesion layer 120 may be provided as an anisotropic conductive film (ACF). For example, the semiconductor package 208 shown in FIG. 3 may be formed by providing the ACF adhesion layer 120 over the first semiconductor chip 106 and over portions of the first conductive patterns 110. Then, the second semiconductor chip 118a or the second insulating body 122 including the second semiconductor chip 118a may be disposed and pressed on the ACF adhesion layer 120 so that the first chip pads 115a are electrically connected to corresponding ones of the first conductive patterns 110 although not shown in detail. If the second semiconductor 118a is formed first, then, the second insulating body 122 may be formed to cover the second semiconductor chip 118a and the ACF adhesion layer 120. Openings may be formed through the second semiconductor chip 118a and filled with a conductive material to form the through-chip vias 114a that interconnect the first chip pads 115a and the second chip pads 115b. Finally, external terminals 112 such as solder balls may be formed on the second chip pads 115b using conventional methods. For example, a portion of the second insulating body 122 is removed to expose a portion of the second chip pads 115b. Next, the external terminals 112 are formed on the exposed portion of the second chip pads 115b.

Figure 4A:
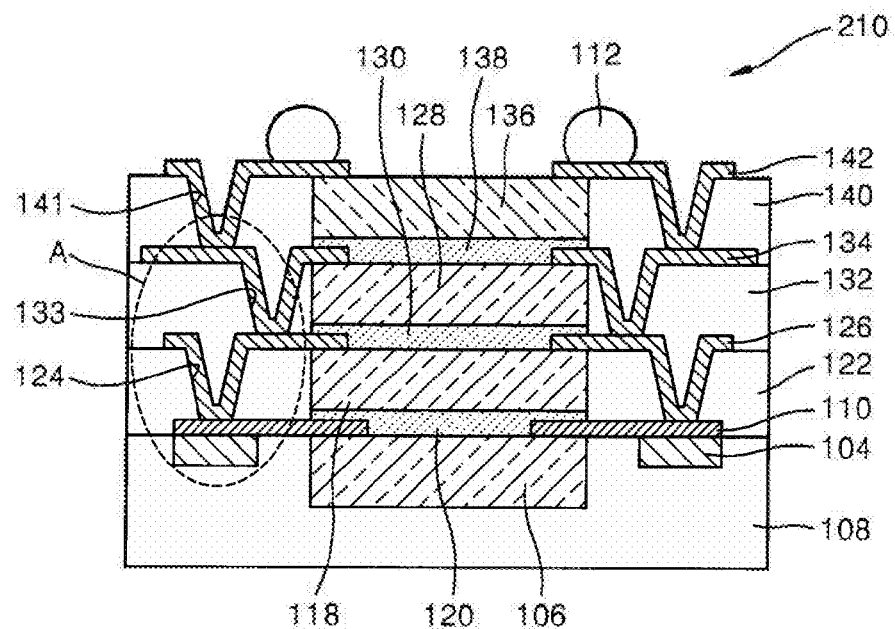
FIG. 4A is a cross-sectional view of a fourth embodiment of a semiconductor package.
Figure 4B:
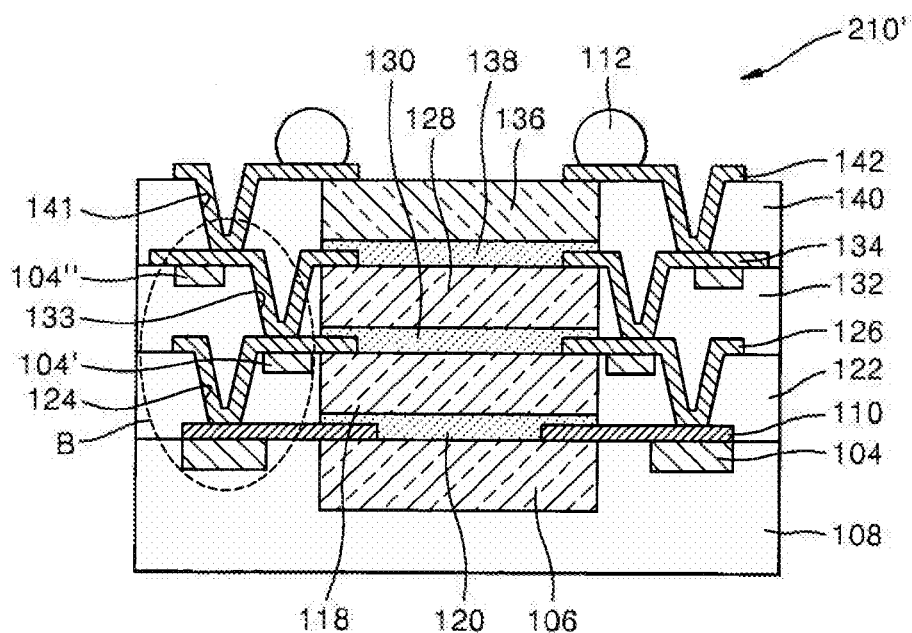
FIGS. 4B and 4C are cross-sectional views of semiconductor packages according to variations of the fourth embodiment.
Figure 4C:
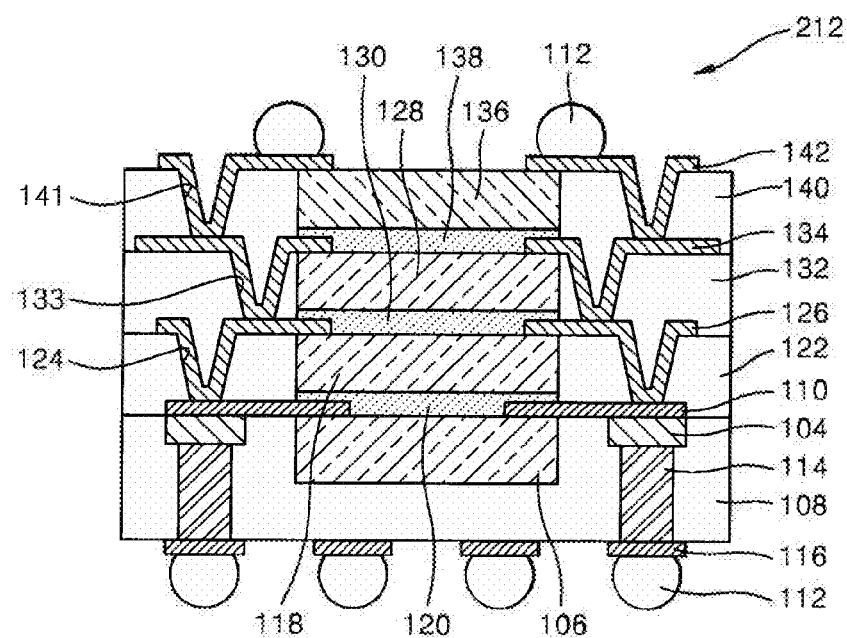

FIG. 4A is a cross-sectional view of a fourth embodiment of a semiconductor package. FIGS. 4B and 4C are cross-sectional views of semiconductor packages according to variations of the fourth embodiment.

Referring to FIG. 4A, a semiconductor package 210 may be provided as similarly described above with respect to the semiconductor package 204 shown in FIG. 2A, but may further include additional semiconductor chips (e.g., semiconductor chips 128 and 136, also referred to herein as a "third semiconductor chip 128" and a "fourth semiconductor chip 136," respectively), additional adhesion layers (e.g., adhesion layers 130 and 138, also referred to herein as a "second adhesion layer 130" and a "third adhesion layer 138," respectively), additional insulating bodies (e.g., insulating bodies 132 and 140, also referred to herein as a "third insulating body 132" and a "fourth insulating body 140," respectively) and additional conductive patterns (e.g., conductive patterns 134 and 142, also referred to herein as "third conductive patterns 134" and "fourth conductive patterns 142," respectively).

According to some embodiments, the additional semiconductor chips, the additional adhesion layers, the additional insulating bodies, and the additional conductive patterns may be provided in a manner similar to the second semiconductor chip 118, first adhesion layer 120, second insulating body 122, second conductive patterns 126 described above with respect to FIG. 2A.

For example, the third insulating body 132 may be disposed over the second insulating body 122 and include second cavities 133 extending from an upper surface thereof to a lower surface thereof. The third semiconductor chip 128 may be disposed within the third insulating body 132 and the third conductive patterns 134 may be electrically connected to the third semiconductor chip 128. The second adhesion layer 130 is disposed between the second semiconductor chip 118 and the third semiconductor chip 128 to adhere the second semiconductor chip 118 to the third semiconductor chip 128. Further, corresponding ones of the third conductive patterns 134 and corresponding ones of the second conductive patterns 126 may be electrically connected to each other through corresponding ones of second cavities 133.

Similarly, the fourth insulating body 140 may be disposed over the third insulating body 132 and include third cavities 141 extending from an upper surface thereof to a lower surface thereof. The fourth semiconductor chip 136 may be disposed within the fourth insulating body 140 and the fourth conductive patterns 142 may be electrically connected to the fourth semiconductor chip 136. The third adhesion layer 138 is disposed between the third semiconductor chip 128 and the fourth semiconductor chip 136 to adhere the third semiconductor chip 128 to the fourth semiconductor chip 136. Further, corresponding ones of the fourth conductive patterns 142 and corresponding ones of the third conductive patterns 134 may be electrically connected to each other through corresponding ones of third cavities 141.

In the semiconductor package 210 shown in FIG. 4A, however, the external terminals 112 are connected to corresponding ones of the fourth conductive patterns 142 instead of the second conductive patterns 126. It will be appreciated, however, that the fourth semiconductor chip 136, third adhesion layer 138, fourth insulating body 140 and fourth conductive pattern 142 may be omitted. Consequently, the external terminals 112 may be connected to corresponding ones of the third conductive patterns 134 instead of the fourth conductive patterns 142.

Referring to FIG. 4B, a semiconductor package 210' may be provided as similarly described above with respect to the semiconductor package 210 shown in FIG. 4A, but may further include posts 104' disposed within the second insulating body 122. In one embodiment, the semiconductor package 210' may further include posts 104" disposed within the third insulating body 132. According to some embodiments, the compositions and dimensions of posts 104' and 104" may be similar to the compositions and dimensions of the posts 104 discussed previously. According to some embodiments, the dimensions of the posts 104' and 104" relative to the second and third semiconductor chips 118 and 128, respectively, may be similar to dimensions of the posts 104 relative to the first semiconductor chip 106 discussed previously. According to some embodiments, the dimensions of the posts 104' and 104" relative to the second and third insulating bodies 122 and 132, respectively, may be similar to dimensions of the posts 104 relative to the first insulating body 108 discussed previously.

In one embodiment, the posts 104' may be disposed within the second insulating body 122 at locations laterally between the first cavities 124 and sides of the second semiconductor chip 118. In another embodiment, the posts 104' may be disposed within the second insulating body 122 at locations adjacent to the first cavities 124 such that the first cavities 124 are disposed laterally between the posts 104' and sides of the second semiconductor chip 118.

In one embodiment, the posts 104" may be disposed within the third insulating body 132 at locations adjacent to the second cavities 133 such that the second cavities 133 are disposed laterally between the posts 104" and sides of the third semiconductor chip 128. In another embodiment, the posts 104" may be disposed within the third insulating body 132 at locations laterally between the second cavities 133 and sides of the third semiconductor chip 128.

According to some embodiments, the posts 104' and 104" may be formed by, for example, forming recesses within the upper surfaces of corresponding ones of the second and third insulating bodies 122 and 132, respectively, followed by filling the recesses with conductive or insulative material. However, the present invention is not limited to this particular method of forming the posts 104' and 104" and other suitable methods can be used instead within the spirit and scope of the present invention.

Referring to FIG. 4C, a semiconductor package 212 may be provided as similarly described above with respect to the semiconductor package 210 shown in FIG. 4A, but may further include through vias 114 and auxiliary wiring patterns 116 as previously described with respect to FIG. 1B.

FIGS. 5A-5D are enlarged cross-sectional views of the structure disposed in region "A" of the semiconductor package shown in FIG. 4A, according to some embodiments.

As mentioned above, a patterned insulating layer may be interposed between the first conductive patterns 110 and the first insulating body 108. Such a patterned insulating layer (also referred to herein as a "first patterned insulating layer") is identified in FIGS. 5A-5D at 144C. Similar to the first patterned insulating layer 144C, a second patterned insulating layer 144B may be interposed between the second conductive patterns 126 and the second insulating body 122. A third patterned insulating layer 144A is also exemplarily shown as being interposed between the third conductive patterns 134 and the third insulating body 132. The first, second and third patterned insulating layers (i.e., the ILD layers) 144C, 144B and 144A, respectively, may include a material such as a porous dielectric material, a polymer, a resin, epoxy, or the like or a combination thereof. The first, second and third patterned insulating layers 144C, 144B and 144A, respectively, may be formed by any suitable process such as spin coating or the like.

Referring to the embodiment exemplarily illustrated in FIG. 5A, the locations of the first cavities 124 within the second insulating body 122 may substantially correspond to location of the posts 104 within the first insulating body 108. Accordingly, the first cavities 124 may be disposed at locations directly above corresponding ones of the posts 104.

In one embodiment, the second conductive patterns 126 may be disposed over the second patterned insulating layer 144B, as well as along edges of the second insulating body 122 defining sidewalls of the first cavities 124 and on a portion (e.g., a top surface) of corresponding ones of the first conductive patterns 110. Accordingly, the first cavities 124 can be characterized as being lined with a conductive material. Similarly, the third conductive patterns 134 may be disposed over the third patterned insulating layer 144A, as well as along edges of the third insulating body 132 defining sidewalls of the second cavities 133 and on a portion (e.g., a top surface) of corresponding ones of the second conductive patterns 126. Accordingly, the second cavities 133 can be characterized as being lined with a conductive material.

In another embodiment, the fourth insulating body 140 is formed within the second cavities 133. Accordingly, the second cavities 133 can also be characterized as being filled with an insulating material.

In still another embodiment, portions of the third insulating body 132 are disposed within the first cavities 124 and locations of the second cavities 133 within the third insulating body 132 substantially correspond to locations of the first cavities 124 within the second insulating body 122. Therefore, locations of the second cavities 133 within the third insulating body 132 may substantially correspond to locations of the posts 104 within the first insulating body 108. Accordingly, second cavities 133 may be disposed at locations directly above corresponding ones of the posts 104.

In yet another embodiment, the third conductive patterns 134 electrically contact portions (e.g., top surfaces) of corresponding ones of the second conductive patterns 126 that are disposed within the first cavities 124. Accordingly, the third conductive patterns 134 can be characterized as being disposed within corresponding ones of the first cavities 124.

Referring to the embodiment exemplarily illustrated in FIG. 5B, the structure disposed in region "A" of the semiconductor package shown in FIG. 4A is similar to the structure described with respect to FIG. 5A. However, the structure exemplarily illustrated in FIG. 5B differs from the structure shown in FIG. 5A because locations of the second cavity 133 within the third insulating body 132 do not correspond to locations of the first cavities 124 within the second insulating body 122 in contrast with the embodiment shown in FIG. 5A. The first cavities 124 can be characterized as being filled with an insulating material (i.e., the third insulating body 132).

In one embodiment, the third conductive patterns 134 electrically contact portions (e.g., top surfaces) of corresponding ones of the second conductive patterns 126 that are disposed outside the first cavities 124. Accordingly, the third conductive patterns 134 may electrically contact portions of corresponding ones of the second conductive patterns 126 that overlie the second patterned insulating layer 144B.

Figure 5C:
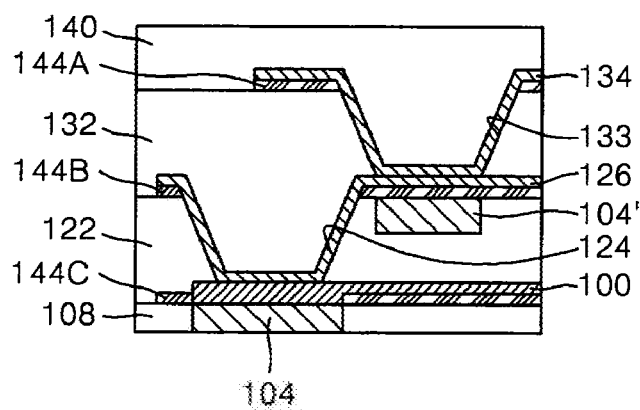

Referring to the embodiment exemplarily illustrated in FIG. 5C, the structure disposed in region "A" of the semiconductor package shown in FIG. 4A is similar to the structure described with respect to FIG. 5B. However, the structure exemplarily illustrated in FIG. 5C differs from the structure shown in FIG. 5B in that the aforementioned posts 104' are disposed within the second insulating body 122 at locations substantially corresponding to locations of the third cavities 133 within the third insulating body 132. Accordingly, posts 104' may be disposed at locations directly below corresponding ones of the cavities 133. Thus, the structure exemplarily illustrated in FIG. 5C corresponds to region "B" of the semiconductor package 210' exemplarily illustrated in FIG. 4B.

Figure 5D:
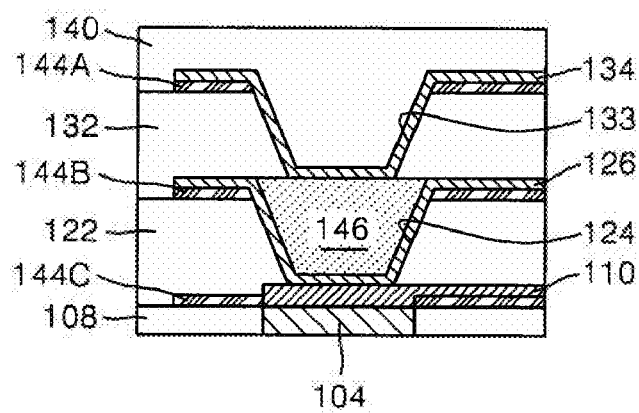

Referring to FIG. 5D, the structure exemplarily illustrated therein differs from the structure shown in FIG. 5A because conductive plugs 146 are formed within the first cavities 124. Accordingly, the first cavities 124 can be characterized as being filled with a conductive material. In one embodiment, upper surfaces of the conductive plugs 146 may be substantially coplanar with upper surfaces of the second conductive patterns 126.

Due to the presence of the conductive plug 146, portions of the third insulating body 132 are disposed directly over—but not within, the first cavities 124. In addition, the third conductive patterns 134 electrically contact portions (e.g., top surfaces) of corresponding ones of the conductive plugs 146 that are disposed within the first cavities 124.

Figure 6A:
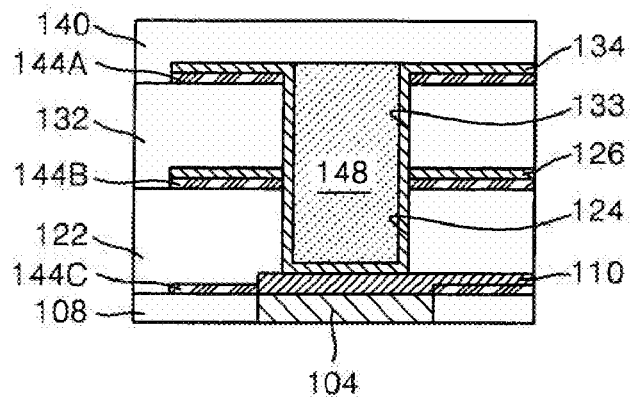
FIGS. 6A-6C are enlarged cross-sectional views of the structure disposed in region "A" of the semiconductor package shown in FIG. 4A, according to some other embodiments.
Figure 6B:
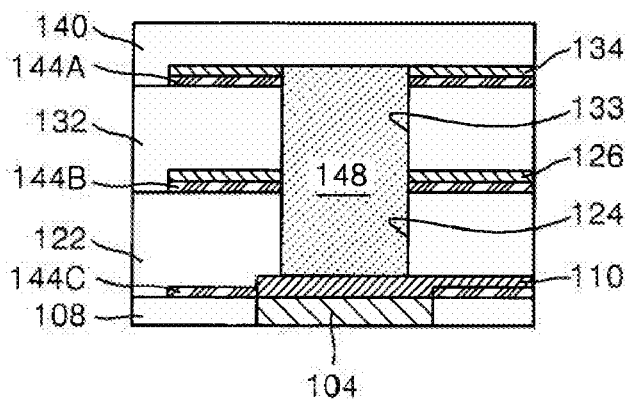
Figure 6C:
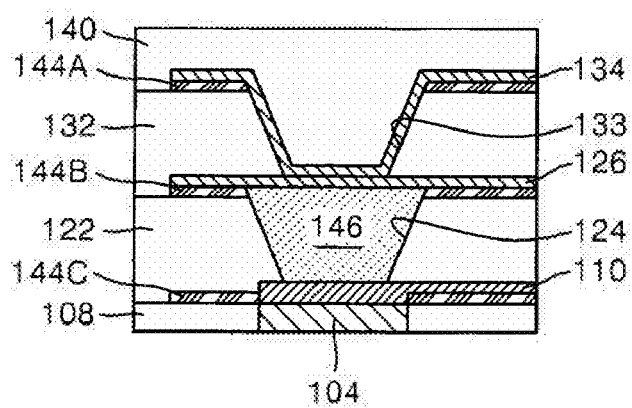

FIGS. 6A-6C are enlarged cross-sectional views of the structure disposed in region "A" of the semiconductor package shown in FIG. 4A, according to some other embodiments.

Referring to the embodiment exemplarily illustrated in FIG. 6A, the locations of the first cavities 124 within the second insulating body 122 may substantially correspond to locations of the posts 104 within the first insulating body 108. Accordingly, the first cavities 124 may be disposed at locations directly above corresponding ones of the posts 104.

In one embodiment, locations of the second cavities 133 within the third insulating body 132 substantially correspond to locations of the first cavities 124 within the second insulating body 122. Therefore, locations of the second cavities 133 within the third insulating body 132 may substantially correspond to locations of the posts 104 within the first insulating body 108. Accordingly, second cavities 133 may be disposed at locations directly above corresponding ones of the posts 104.

In one aspect, the second conductive patterns 126 may be disposed over the second patterned insulating layer 144B, but not along edges of the second insulating body 122 defining sidewalls of the first cavities 124 or on portions (e.g., top surfaces) of corresponding ones of the first conductive patterns 110. In yet another aspect, the second conductive patterns 126 may be provided as line-type patterns, extending primarily along a single direction away from the second semiconductor chip 118.

The third insulating body 132 may be disposed over the second insulating body 122, but not within the first cavities 124.

In one embodiment, the first and second cavities 124 and 133 may be formed in a single patterning process. For example, after the second insulating body 122, second patterned insulating layer 144B, second conductive patterns 126, third insulating body 132 and third patterned insulating layer 144A are formed, the resultant structure may be subjected to a patterning process that successively forms the second cavities 133 within the third insulating body 132 and first cavities 124 within the second insulating body 122. Thus, the first and second cavities 124 and 133 may be characterized as a single cavity extending contiguously through the second and third insulating bodies 122 and 132. In one embodiment, the patterning process may be a laser drilling process performed with a UV laser. Accordingly, sidewalls of the first and second first and second cavities 124 and 133 may be substantially vertical.

As described above in the Description of the Related Art, conventional laser drilling processes employ IR lasers which can create openings with sidewalls that create adhesion problems with subsequently formed conductive patterns. Light emitted by UV lasers, however, has a relatively short wavelength. Consequently, UV laser light scatters less as it passes through encapsulation material. Accordingly, the UV laser drilling process may produce cavities 124 with sidewalls that are substantially less damaged. As a result, the adhesion between the first insulating body 108 (or the encapsulant material) and conductive plugs 148 of FIG. 6A, which will be explained further below, can be significantly improved.

Furthermore, during the high power UV laser drilling process, as the post 104 is disposed below the location of the cavities 124 acting as a buffer, even if the UV laser damages or punctures the first conductive patterns 110, the post 104 still remains under the first conductive patterns 110.

Consequently, the electrical signal connection between the semiconductor chips, e.g., 118 and the external terminals 112 can be secured, thereby improving the reliability of the resulting electronic products. In other words, with the presence of the post 104, the UV laser drilling process can now be used instead of the conventional IR laser process which has many reliability issues described above.

Also, UV laser drilling processes may be used to produce cavities 124 having substantially vertical sidewalls. By forming cavities 124 with substantially vertical sidewalls, the distance between adjacent external terminals 112, i.e., pitch, can be reduced. Therefore, more external terminals can be provided within the same area, thereby increasing the signal density and design margin of the semiconductor package.

In another embodiment, the third conductive patterns 134 may be disposed over the third patterned insulating layer 144A, as well as along edges of the third insulating body 132 defining sidewalls of the second cavities 133, along edges of the second conductive patterns 126 disposed outside the first cavities 124, along edges of the second insulating body 122 defining sidewalls of the first cavities 124 and on portions (e.g., top surfaces) of corresponding ones of the first conductive patterns 110 disposed below the first cavities 124. Accordingly, the third conductive patterns 134 can be characterized as being disposed within corresponding ones of the first cavities 124 and the second cavities 133.

In yet another embodiment, the conductive plugs 148 may be formed on the third conductive patterns 134 so as to extend through the second and first cavities 133 and 124, respectively. Accordingly, the first and second cavities 124 and 133 may be filled with a conductive material. In one embodiment, upper surfaces of the conductive plugs 148 may be substantially coplanar with upper surfaces of the third conductive patterns 134.

Referring to FIG. 6B, the structure exemplarily illustrated therein differs from the structure shown in FIG. 6A because the first and second cavities 124 and 133, respectively, are formed after the third conductive patterns 134 are formed on the third patterned insulating layer 144A. Consequently, the third conductive patterns 134 may be disposed over the third patterned insulating layer 144A, but not along edges of the third insulating body 132 defining sidewalls of the second cavities 133 or on portions (e.g., top surfaces) of corresponding ones of the first conductive patterns 110. In one embodiment, the third conductive patterns 132 may be provided as line-type patterns, extending primarily along a single direction away from the third semiconductor chip 128.

Referring to the embodiment exemplarily illustrated in FIG. 6C, the locations of the first cavities 124 within the second insulating body 122 may substantially correspond to locations of the posts 104 within the first insulating body 108. Accordingly, the first cavities 124 may be disposed at locations directly above corresponding ones of the posts 104.

In one embodiment, locations of the second cavities 133 within the third insulating body 132 substantially correspond to locations of the first cavities 124 within the second insulating body 122. Therefore, locations of the second cavities 133 within the third insulating body 132 may substantially correspond to locations of the posts 104 within the first insulating body 108. Accordingly, the second cavities 133 may be disposed at locations directly above corresponding ones of the posts 104.

In one embodiment, conductive plugs 146 are formed within the first cavities 124. Accordingly, the first cavities 124 can be characterized as being filled with a conductive material. In one embodiment, upper surfaces of the conductive plugs 146 may be substantially coplanar with an upper surface of the second patterned insulating layer 144B.

In one embodiment, the second conductive patterns 126 are formed over the conductive plugs 146.

In another embodiment, the third insulating body 132 is disposed over the second conductive patterns 126 so as to overlap at least a portion of the second insulating body 122 and a portion of the conductive plugs 146. A third patterned insulating layer 144A is formed over the second insulating body 132. The third conductive patterns 134 may then be disposed over the third patterned insulating layer 144A, as well as along edges of the third insulating body 132 defining sidewalls of the second cavities 133 and on portions (e.g., top surfaces) of corresponding ones of the second conductive patterns 126. Accordingly, the second cavities 133 can be characterized as being lined with a conductive material. The third conductive patterns 134 may be disposed over portions of corresponding ones of the conductive plugs 146.

In one embodiment, the first and second cavities 124 and 133 may be formed in different patterning processes. For example, after the second insulating body 122 and second patterned insulating layer 144B are formed, the resultant structure may be subjected to a first patterning process that forms the first cavities 124 within the second insulating body 122. Then, after the conductive plugs 146, the second conductive patterns 126, the third insulating body 132 and the third patterned insulating layer 144A are formed, the resultant structure may be subjected to a second patterning process that forms the second cavities 133 within the third insulating body 132. Thus, the first and second cavities 124 and 133 may be characterized as a multiple cavities extending discretely through the second and third insulating bodies 122 and 132. In one embodiment, the first and second patterning processes may be any suitable process.

In some embodiments, sidewalls of the first and second cavities 124 and 133 may be oblique. Also, an upper surface of the conductive plug 146 may be higher than an upper surface of the second insulating body 122.

FIGS. 7A-7F are cross-sectional views illustrating exemplary processes for forming the semiconductor package shown in FIG. 1A according to one embodiment of the present invention.

Figure 7A:
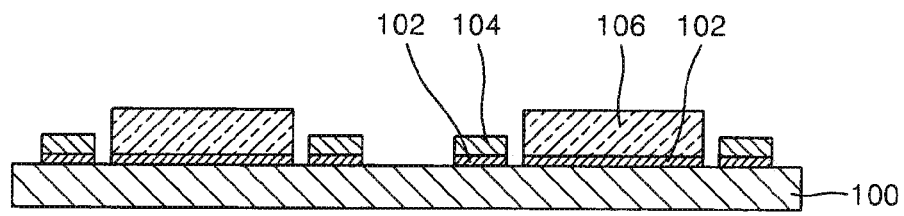
FIGS. 7A-7F are cross-sectional views illustrating exemplary processes for forming the semiconductor package shown in FIG. 1A.

Referring to FIG. 7A, semiconductor chips 106 may be attached to a surface of a carrier substrate 100. In addition, posts 104 may be attached to the surface of the carrier substrate 100.

In one embodiment, the active surfaces of the semiconductor chips 106 may be attached to the surface of the carrier substrate 100. Accordingly, the active surfaces of the semiconductor chips 106 face towards the carrier substrate 100 while back surfaces of the semiconductor chips 106, opposite the active surfaces of the semiconductor chips 106 face away from the carrier substrate 100.

In another embodiment, the semiconductor chips 106 may be attached to the surface of the carrier substrate 100 by providing a sacrificial material 102 on the surface of the carrier substrate 100 and then coupling the semiconductor chips 106 to the sacrificial material 102. Similarly, the posts 104 may be attached to the surface of the carrier substrate 100 by coupling the posts 104 to the sacrificial material 102.

In one embodiment, the sacrificial material 102 may be provided as an adhesive material. In another embodiment, the sacrificial material 102 is an adhesive material that is sensitive to at least one of heat and light. That is, upon exposure to at least one of heat and light, the adhesive characteristics of the sacrificial material become degraded.

In one embodiment, the posts 104 may be attached to the surface of the carrier substrate 100 by forming a material layer over the surface of the carrier substrate 100 followed by patterning the material layer. In another embodiment, the posts 104 may be pre-formed before being attached to the surface of the carrier substrate 100 (e.g., as in leads of a lead frame). It will be appreciated that the posts 104 may be attached to the carrier substrate 100 before or after the semiconductor chip 106 is attached to the carrier substrate 100. In one embodiment, the posts 104 may be formed of a conductive material (e.g., Cu, Fe, Ag, Au, Al, conductive polymer having a high adhesive strength with the sacrificial material 102, or the like or a combination thereof) or an insulating material (e.g., a dielectric).

In one embodiment, the carrier substrate 100 may include a material that is transparent to light used in degrading the adhesive characteristics of the sacrificial material 102. In another embodiment, the carrier substrate 100 may include a material that suitably conducts heat used in degrading the adhesive characteristics of the sacrificial material 102. Exemplary materials for the carrier substrate 100 include a metal or polyimide.

Figure 7B:
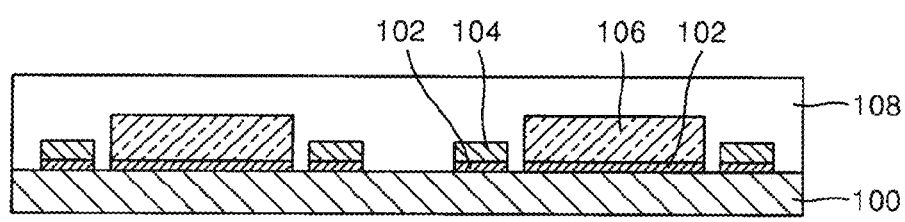

Referring to FIG. 7B, an insulating material may be provided over the surface of the carrier substrate 100 so as to encapsulate the semiconductor chips 106 and the posts 104. Upon encapsulating the semiconductor chips 106 and posts 104, the insulating material forms an insulating body 108 or an encapsulant.

Figure 7C:
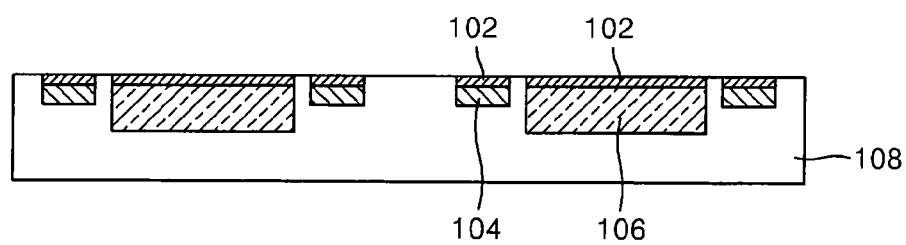

Referring to FIG. 7C, the carrier substrate 100 is separated from the semiconductor chips 106, the posts 104 and the insulating body 108.

In one embodiment, the carrier substrate 100 is separated from the semiconductor chips 106, the posts 104 and the insulating body 108 by exposing the sacrificial material 102 to at least one of light and heat. Upon exposing the sacrificial material 102 to at least one of light and heat, the adhesive characteristics of the sacrificial material 102 are degraded to thereby facilitate separation of the carrier substrate 100 from the semiconductor chips 106 and the posts 104.

After separating the carrier substrate 100 from the semiconductor chips 106 and the posts 104, a planarization process (e.g., an etch-back process) may be performed to remove the sacrificial material 102 and portions of the insulating body 108 protruding above the active surface of the semiconductor chip and the top surfaces of the posts 104. Accordingly, portions (i.e., the active surfaces) of the semiconductor chips 106, e.g., chip pad regions (not shown) and portions (i.e., top surfaces) of the posts 104 may be exposed by the insulating body 108.

Figure 7D:
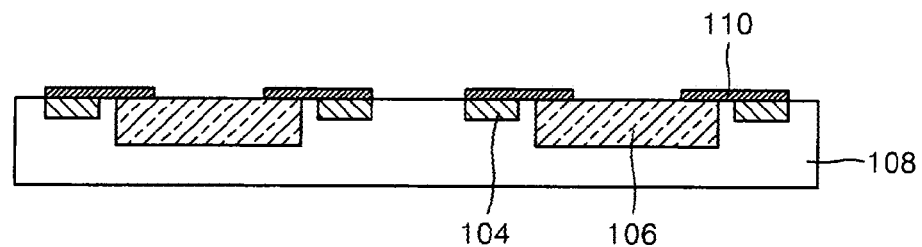

Referring to FIG. 7D, a conductive pattern 110 may be formed over the insulating body 108. In one embodiment, the conductive pattern 110 may electrically connect the exposed portions (i.e., the active surfaces) of the semiconductor chips 106 and the exposed portions (i.e., the top surfaces) of the posts 104.

In one embodiment, a patterned insulating layer (see, e.g., patterned insulating layer 144C in FIGS. 5A-5C and 6A-6C) may be formed before forming the conductive patterns 110. Accordingly, the patterned insulating layer may be formed over the active surfaces of the semiconductor chips 106, the top surfaces of the posts 104 and the insulating body 108 and expose chip pad regions in the active surfaces of the semiconductor chips 106 as well as the top surfaces of the posts 104. In one embodiment, the patterned insulating layer may be formed by forming a material layer over the active surfaces of the semiconductor chips 106, the top surfaces of the posts 104 and the insulating body 108 followed by patterning the material layer to expose chip pad regions in the active surfaces of the semiconductor chips 106 as well as the top surfaces of the posts 104.

After forming the patterned insulating layer as described in the paragraph above, the conductive pattern 110 may be formed. In one embodiment, the conductive pattern 110 may be formed by forming a seed layer on the active surfaces of the semiconductor chips 106 (e.g., on chip pad regions in the active surfaces) as well as on top surfaces of the posts 104 (e.g., by sputtering) followed by forming a conductive layer on the seed layer. The conductive layer may be formed by electroplating, electroless plating, or the like or a combination thereof. It will be appreciated that other known methods can be used to form the conductive patterns 110 within the spirit and scope of the present invention. For example, a conductive layer is deposited using chemical vapor deposition (CVD) over the semiconductor chips 106 and patterned to form the conductive patterns 110.

Figure 7E:
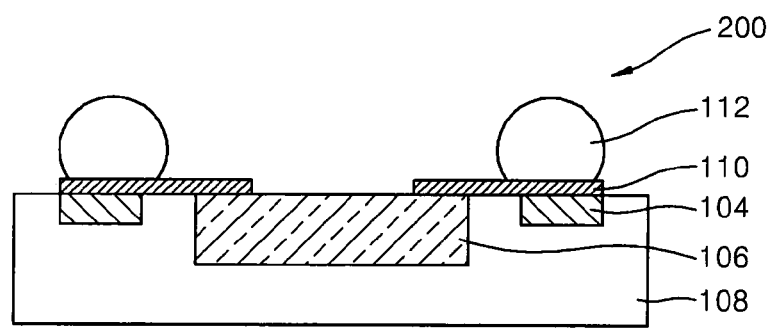

Referring to FIG. 7E, external terminals 112 may be formed on the conductive patterns 110 and groups of semiconductor chips 106 and posts 104 may be singulated to form individual semiconductor packages including, for example, a semiconductor chip 106 and posts 104. In one embodiment, the external terminals 112 may be provided as conductive balls such as solder balls or conductive bumps.

Figure 7F:
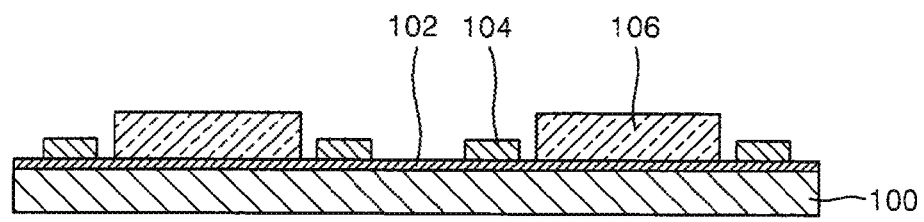

In the embodiment exemplarily shown in FIG. 7F, the sacrificial layer 120 may be formed so as to be continuously formed over the surface of the carrier substrate 100 instead of being discontinuously formed over the surface of the carrier substrate 100 as shown in FIG. 7A.

Due to the presence of the conductive pattern 110 and posts 104, the semiconductor chip 106 can be effectively packaged even when the pitch between adjacent chip pad regions in the active surface of the semiconductor chips 106 is small.

FIGS. 8A-8E are cross-sectional views illustrating exemplary processes for forming the semiconductor package shown in FIG. 2A.

In one embodiment, processes for forming the semiconductor package 204 shown in FIG. 2A can be performed by first performing the processes described with respect to FIGS. 7A-7D. Next, referring to FIG. 8A, second semiconductor chips 118 may be provided over the first semiconductor chips 106. In one embodiment, the second semiconductor chips 118 may be provided over corresponding ones of the first semiconductor chips 106 by providing an adhesion layer 120 on the exposed portions (i.e., active surfaces) of the first semiconductor chips 106 and coupling the second semiconductor chips 118 to the adhesion layer 120.

In one embodiment, back surfaces of the second semiconductor chips 118 face toward the active surfaces of the first semiconductor chips 106 and active surfaces of the second semiconductor chips 118 face away from the active surfaces of the first semiconductor chips 106.

Figure 8A:
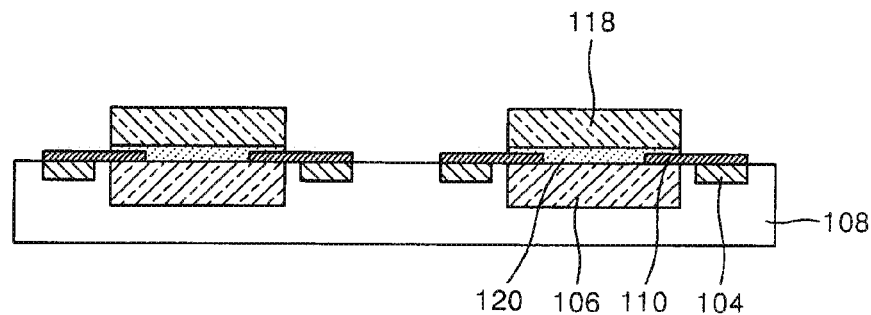
FIGS. 8A-8E are cross-sectional views illustrating exemplary processes for forming the semiconductor package shown in FIG. 2A.
Figure 8B:
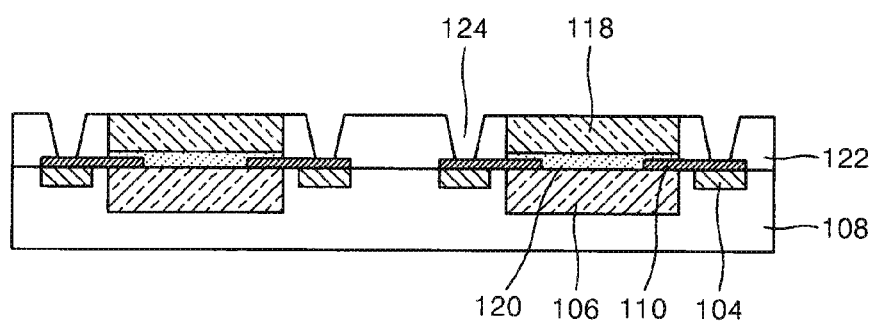

Referring to FIG. 8B, a second insulating body 122 is formed over the first insulating body 108. In one embodiment the second insulating body 122 is formed by providing an insulating material over the first insulating body 108 and the first conductive patterns 110 and forming cavities 124 to extend through the insulating material. In one embodiment, the locations of the cavities 124 within the second insulating body 122 substantially correspond to locations of corresponding ones of the posts 104 within the first insulating body 108. That is, the cavities 124 are formed in regions directly overlying corresponding ones of the posts 104 such that the posts 104 act as buffer layers during the formation of the cavities 124.

In one embodiment, the cavities 124 may be formed in the second insulating body 122 by subjecting the second insulating body 122 to a laser drilling process, a dry etching process, a wet etching process, or the like or a combination thereof. In one embodiment, the laser drilling process includes a process in which the second insulating body 122 is exposed to light emitted from an ultraviolet (UV) laser. In this sense, the laser drilling process can be characterized as a UV laser drilling process.

Because the posts 104 can be located below the second conductive patterns 126, which are connected to the external terminals 112, junction reliability between the external terminals 112 and the second conductive patterns 126 can be improved. Further, in embodiments where the posts 104 are conductive, a reliable electrical connection can be maintained between the second conductive patterns 126 and the first semiconductor chip 106 even when the first cavities 124 extend below the second insulating body 122 as discussed above. In addition, noise between the signal lines can be reduced and power supply or ground can be stabilized, thereby improving reliability of the electronic devices.

Figure 8C:
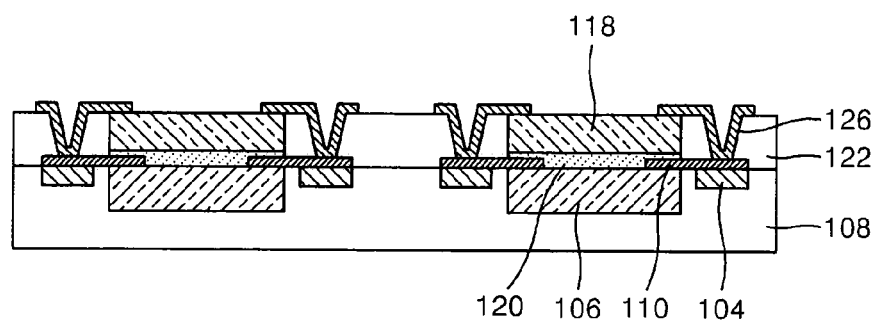

Referring to FIG. 8C, second conductive patterns 126 are then formed over the second insulating body 122 and within the cavities 124 so as to contact portions (e.g., top surfaces) of corresponding ones of the first conductive patterns 110. Accordingly, corresponding ones of the second conductive patterns 126 and the first conductive patterns 110 are electrically connected to each other through the cavities 124.

The second conductive patterns 126 may be formed according to a process similar to that previously described with respect to the formation of the first conductive patterns 110. For example, the second conductive patterns 126 may be formed by first forming a second patterned insulating layer (see, e.g., patterned insulating layer 144B in FIGS. 5A-5C and 6A-6C) over the active surfaces of the second semiconductor chips 118 and the second insulating body 122, followed by forming of the second conductive patterns 126 on the second patterned insulating layer. In one embodiment, the second patterned insulating layer may be formed by forming a material layer over the active surface of the second semiconductor chip 118 and the second insulating body 122 followed by patterning the material layer to expose chip pad regions in the active surfaces of the second semiconductor chips 118 as well as regions of the second insulating body 122. Next, a seed layer may be formed on the active surface of the second semiconductor chip 118 (e.g., on chip pad regions in the active surface) as well as on regions of the second insulating body 122 (e.g., by sputtering). Then, a conductive layer may be formed on the seed layer by electroplating, electroless plating, or the like or a combination thereof.

Figure 8D:
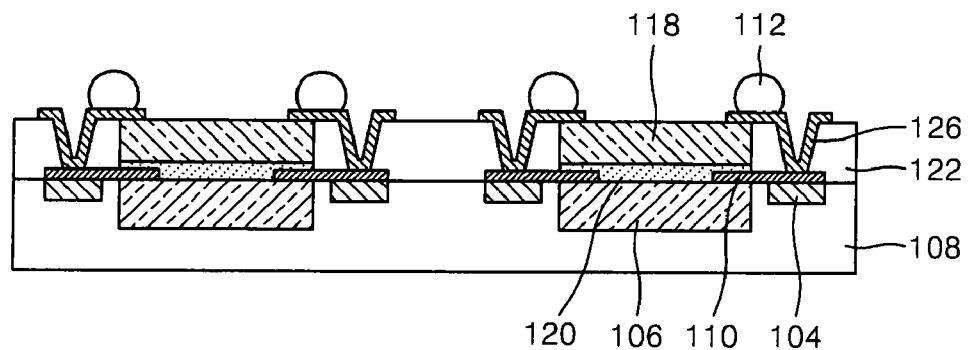

Referring to FIG. 8D, external terminals 112 may be formed on the second conductive patterns 126. In one embodiment, the external terminals 112 may be provided as solder balls or conductive balls.

Figure 8E:
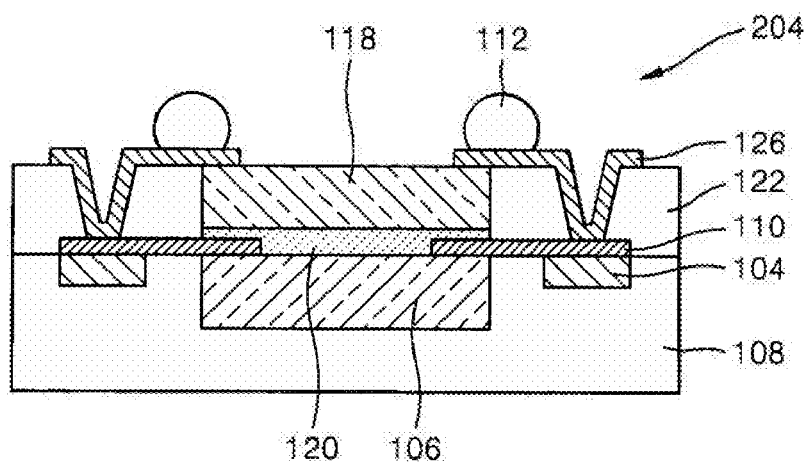

Referring to FIG. 8E, a singulation process is performed to separate stacked semiconductor packages from each other.

Due to the presence of the conductive pattern 110 and posts 104, the second semiconductor chips 118 can be effectively packaged even when the pitch between adjacent chip pad regions in the active surfaces of the second semiconductor chips 118 are small.

Figure 9:
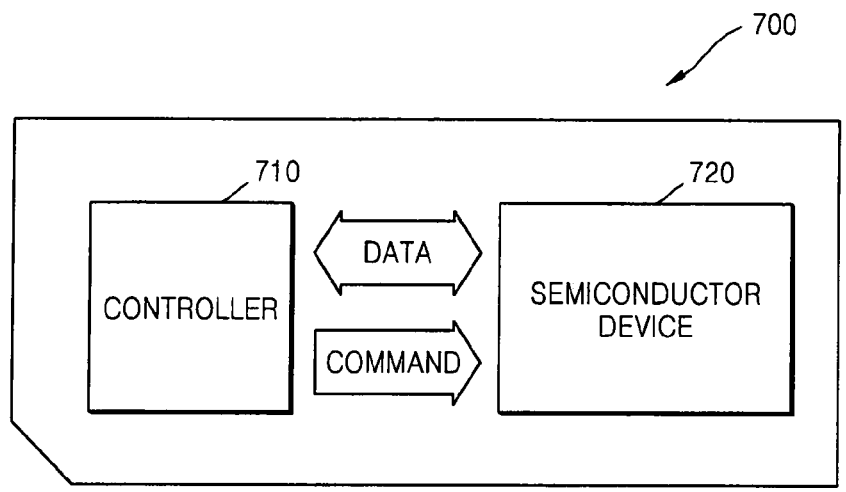
FIG. 9 is a schematic view of a card incorporating one or more semiconductor packages described herein.

FIG. 9 is a schematic view of a card system incorporating one or more semiconductor packages described above.

Referring to FIG. 9, a card system 700 incorporating one or more semiconductor packages described above may, for example, include a controller 710 in electrical communication with a semiconductor device 720. In some embodiments, the semiconductor device 720 is formed to incorporate the controller 710 therein.

In one embodiment, the semiconductor device 720 may include any semiconductor package as exemplarily described above. Accordingly, the semiconductor device may be characterized as including, for example, an insulating body; a semiconductor chip having an active surface and a back surface opposite the active surface, the semiconductor chip disposed within the insulating body, the active surface exposed by the insulating body, the back surface substantially surrounded by the insulating body; a post disposed within the insulating body and adjacent to a side of the semiconductor chip; and a conductive pattern disposed on the insulating body and on the top surface of the post exposed by the insulating body, the conductive pattern electrically connected to the semiconductor chip.

In one embodiment, the card system 700 may be provided as a multimedia card or a secure digital card.

Figure 10:
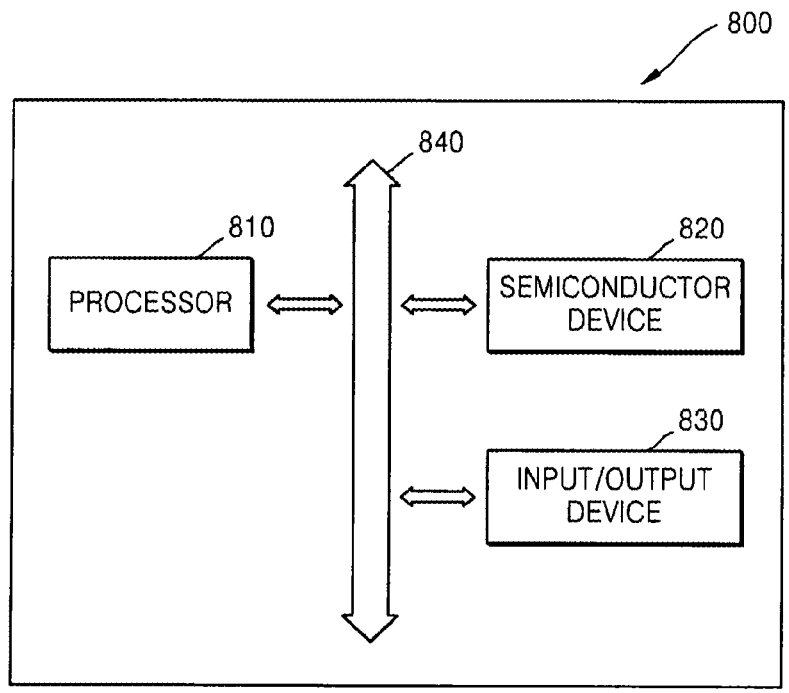
FIG. 10 is a schematic view of a system incorporating one or more semiconductor packages described herein.

FIG. 10 is a schematic view of a system incorporating one or more semiconductor packages described above.

Referring to FIG. 10, a system 800 incorporating one or more semiconductor packages described above may, for example, include a processor 810, a semiconductor device 820, an input/output device 830 and a bus 840. The input/output device 830 can be electrically coupled to the microprocessor 810 and the semiconductor device 820 (e.g., via the bus 840).

In one embodiment, the semiconductor device 820 may include any semiconductor package as exemplarily described above. Accordingly, the semiconductor device 820 may be characterized as including, for example, an insulating body; a semiconductor chip having an active surface and a back surface opposite the active surface, the semiconductor chip disposed within the insulating body, the active surface exposed by the insulating body, the back surface substantially surrounded by the insulating body; a post disposed within the insulating body and adjacent to a side of the first semiconductor chip; and a conductive pattern disposed on the insulating body and on the top surface of the post exposed by the insulating body, the conductive pattern electrically connected to the semiconductor chip.

In one embodiment, the semiconductor device can be provided as, for example, a DRAM, a PRAM, an MRAM, a nonvolatile memory, or the like or a combination thereof.

In one embodiment, the system 800 can be provided as a mobile phone, MP3, navigation, solid state disk (SSD), household appliance, or the like. By incorporating the semiconductor package in accordance with embodiments of the present invention described above in the system 800, the resulting electronic devices are mechanically more robust and the reliability thereof can be significantly improved.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

While embodiments of the present invention have been particularly shown and described above, it will be understood by those of ordinary skill in the art that various changes in form and details may be made therein without departing from the spirit and scope of the present invention as defined by the following claims.

What is claimed is:

1. A semiconductor device, comprising:
    a first insulating body;
    a first semiconductor chip having a first active surface and a first back surface opposite the first active surface, the first semiconductor chip disposed within the first insulating body, the first active surface exposed by the first insulating body, the first back surface located within the first insulating body; and
    a post disposed within the first insulating body and adjacent to a side of the first semiconductor chip, the post having a top surface, a bottom surface and a side surface connecting the top surface and the bottom surface,
    wherein a length of the post in a first direction extending from the top surface of the post toward the bottom surface of the post is smaller than the distance in the first direction between the first active surface of the first semiconductor chip and the first back surface opposite the first active surface.

2. The semiconductor device of claim 1, further comprising a first conductive pattern disposed on the first insulating body and on the top surface of the post exposed by the first insulating body, the first conductive pattern electrically connected to the first semiconductor chip.

3. The semiconductor device of claim 2, wherein a bottom surface of the first conductive pattern is on substantially the same plane with the first active surface of the first semiconductor chip.

4. The semiconductor device of claim 2, wherein the first conductive pattern extends straight from an edge of the first active surface of the semiconductor chip to the post.

5. The semiconductor device of claim 2, wherein the post and the first conductive pattern comprise substantially the same material.

6. The semiconductor device of claim 2, further comprising:
    a second semiconductor chip disposed over the first semiconductor chip; and
    a second conductive pattern electrically connected to the second semiconductor chip and the first conductive pattern.

7. A semiconductor device, comprising:
    a first insulating body;
    a first semiconductor chip having a first active surface and a first back surface opposite the first active surface, the first semiconductor chip disposed within the first insulating body, the first active surface exposed by the first insulating body, the first back surface substantially surrounded by the first insulating body;
    a post disposed within the first insulating body and adjacent to a side of the first semiconductor chip, the post having a top surface, a bottom surface and a side surface connecting the top surface and the bottom surface;
    a first conductive pattern disposed on the first insulating body and on the top surface of the post exposed by the first insulating body, the first conductive pattern electrically connected to the first semiconductor chip;
a second semiconductor chip disposed over the first semiconductor chip; and
a second conductive pattern electrically connected to the second semiconductor chip and the first conductive pattern,
wherein the second semiconductor chip has a second back surface and a second active surface opposite the second back surface, and the second semiconductor chip includes a first chip pad formed on the second back surface and a second chip pad formed on the second active surface, the first chip pad and the second chip pad being electrically connected to each other via the second conductive pattern.

8. The semiconductor device of claim 7, wherein the second conductive pattern comprises a through chip via.

9. The semiconductor device of claim 8, wherein the through chip via is disposed at a location directly above the post.

10. The semiconductor device of claim 7, wherein the first chip pad is electrically connected to the first conductive pattern.

11. The semiconductor device of claim 7, further comprising an anisotropic conductive film (ACF) disposed between the first semiconductor chip and the second semiconductor chip, wherein the second semiconductor chip is electrically connected to the first semiconductor chip through the ACF.

12. The semiconductor device of claim 6, further comprising:
a second insulating body disposed over the first insulating body, the second insulating body comprising a first cavity extending from an upper surface thereof to a lower surface of the second insulating body, wherein
the second semiconductor chip is disposed within the second insulating body,
the second conductive pattern and the first conductive pattern are electrically connected to each other through the first cavity, and
a location of the first cavity within the second insulating body substantially corresponds to a location of the post within the first insulating body.

13. The semiconductor device of claim 12, wherein a portion of the second semiconductor chip is exposed by a lower surface of the second insulating body, the semiconductor device further comprising:
an adhesion layer disposed between the first semiconductor chip and the second semiconductor chip.

14. The semiconductor device of claim 13, further comprising:
a third insulating body disposed over the second insulating body, the third insulating body comprising a second cavity extending from an upper surface thereof to a lower surface thereof;
a third semiconductor chip disposed within the third insulating body; and
a third conductive pattern electrically connected to the third semiconductor chip, wherein the third conductive pattern and the second conductive pattern are electrically connected to each other through the second cavity.

15. The semiconductor device of claim 14, wherein a location of the second cavity within the third insulating body substantially corresponds to a location of the post within the first insulating body.

16. The semiconductor device of claim 14, further comprising a conductive material filling at least one of the first cavity and the second cavity.

17. The semiconductor device of claim 14, further comprising an insulating material filling at least one of the first cavity and the second cavity.

18. The semiconductor device of claim 14, wherein at least one of the second conductive pattern and the third conductive pattern is disposed within the first cavity.

19. The semiconductor device of claim 14, wherein a location of the second cavity in the third insulating body substantially corresponds to a location of the first cavity in the second insulating body,
the second conductive pattern is disposed outside the first cavity,
the third conductive pattern is disposed over the third insulating body, along sidewalls of the second cavity, along sidewalls of the first cavity and on a portion of the first conductive pattern, and
the third conductive pattern contacts an edge of the second conductive pattern,
the semiconductor device further comprising a conductive plug on the third conductive pattern, the conductive plug extending through the first and second cavities.

20. The semiconductor device of claim 19, wherein sidewalls of the first and second cavities are substantially vertical.

21. The semiconductor device of claim 19, wherein an upper surface of the conductive plug is substantially coplanar with an upper surface of the third conductive pattern.

22. The semiconductor device of claim 14, wherein
a location of the second cavity in the third insulating body substantially corresponds to a location of the first cavity in the second insulating body,
the second conductive pattern is disposed outside the first cavity, and
the third conductive pattern is disposed over the third insulating body and outside the second cavity,
the semiconductor device further comprising a conductive plug extending through the first and second cavities and contacting edges of the first and second conductive patterns.

23. The semiconductor device of claim 22, wherein sidewalls of the first and second cavities are substantially vertical.

24. The semiconductor device of claim 22, wherein an upper surface of the conductive plug is substantially coplanar with an upper surface of the third conductive pattern.

25. The semiconductor device of claim 14, further comprising a conductive plug filling the first cavity and disposed on a portion of the first conductive pattern, wherein
a location of the second cavity in the third insulating body substantially corresponds to a location of the first cavity in the second insulating body,
the second conductive pattern is disposed over the conductive plug, and
the third conductive pattern is disposed over the third insulating body, along sidewalls of the second cavity and on a portion of the first conductive pattern.

26. The semiconductor device of claim 25, wherein sidewalls of the first and second cavities are oblique.

27. The semiconductor device of claim 25, wherein an upper surface of the conductive plug is higher than an upper surface of the second insulating body.

28. The semiconductor device of claim 14, further comprising another post disposed within the second insulating body, wherein the another post is disposed below the second cavity.

29. The semiconductor device of claim 1, wherein the first insulating body surrounds the bottom surface and the side surface of the post.

30. A semiconductor device, comprising:
a first insulating body:
a first semiconductor chip having a first active surface and a first back surface opposite the first active surface, the first semiconductor chip disposed within the first insulating body, the first active surface exposed by the first insulating body, the first back surface substantially surrounded by the first insulating body; and
a post disposed within the first insulating body and adjacent to a side of the first semiconductor chip, the post having a top surface, a bottom surface and a side surface connecting the top surface and the bottom surface,
wherein the bottom surface of the post is intermediate between the first active surface and the first back surface of the first semiconductor chip.

31. The semiconductor device of claim 1, further comprising an external terminal in vertical alignment with the post.

32. The semiconductor device of claim 1, wherein the post comprises a conductive material or an insulating material.

33. A semiconductor device, comprising:
a first insulating body having an upper surface and a lower surface opposite the upper surface;
a first semiconductor chip comprising an active surface, a back surface and a plurality of peripheral surfaces connecting the active surface and the back surface, wherein the first insulating body covers the back surface and at least one of the plurality of peripheral surfaces of the first semiconductor chip;
a post disposed within the first insulating body and adjacent to one of the plurality of peripheral surfaces of the first semiconductor chip; and
a first conductive pattern disposed on the upper surface of the first insulating body and extending over the active surface of the first semiconductor chip, wherein the first conductive pattern is connected to the upper surface of the first semiconductor chip,
wherein the post includes an upper surface, a lower surface and a plurality of side surfaces connecting the upper surface and the lower surface, wherein the first insulating body substantially surrounds the lower surface and the plurality of side surfaces of the post, and wherein the lower surface of the post is not connected to any electrically conductive material.

34. The semiconductor device of claim 33, wherein the upper surface of the first insulating body and the upper surface of the first semiconductor chip are substantially coplanar.

35. The semiconductor device of claim 33, further comprising:
an external terminal connected to an upper surface of the first conductive pattern,
wherein the post is connected to a lower surface of the first conductive pattern, and
wherein the external terminal is directly above the post.

36. The semiconductor device of claim 33, further comprising:
an external terminal connected to a portion of an upper surface of the first conductive pattern,
wherein the post is connected to a portion of a lower surface of the first conductive pattern directly opposite the portion of the upper surface of the first conductive pattern connected to the external terminal.

37. A semiconductor device, comprising:
a first insulating body;
a first semiconductor chip having an active surface and a back surface opposite the active surface, the first semiconductor chip disposed within the first insulating body, the active surface exposed by the first insulating body; and
a post disposed within the first insulating body and adjacent to a side of the first semiconductor chip, the post having a top surface, a bottom surface and a side surface connecting the top surface and the bottom surface,
wherein the first insulating body covers the bottom surface and the side surface of the post.

38. A semiconductor device, comprising:
a first insulating body having an upper surface and a lower surface opposite the upper surface;
a first semiconductor chip comprising an active surface, a back surface and a plurality of peripheral surfaces connecting the active surface and the back surface, wherein the first insulating body substantially surrounds the back surface and at least one of the plurality of peripheral surfaces of the first semiconductor chip;
a post disposed within the first insulating body and adjacent to one of the plurality of peripheral surfaces of the first semiconductor chip;
a first conductive pattern disposed on the upper surface of the first insulating body and extending over the active surface of the first semiconductor chip, wherein the first conductive pattern is connected to the active surface of the first semiconductor chip and a lower surface of the first conductive pattern is connected to the post; and
a second semiconductor chip disposed over the first semiconductor chip, wherein the second semiconductor chip comprises a first external terminal formed on a lower surface thereof,
wherein the first external terminal is connected to a portion of an upper surface of the first conductive pattern directly opposite the portion of the lower surface of the first conductive pattern connected to the post, and
wherein a length of the post in a first direction extending from the upper surface of the first insulating body toward the lower surface opposite the upper surface is smaller than the distance in the first direction between the upper surface of the first insulating body and the lower surface opposite the upper surface.

39. The semiconductor device of claim 38, wherein the second semiconductor chip is larger than the first semiconductor chip.

40. The semiconductor device of claim 38, wherein the second semiconductor chip further comprises:
another external terminal formed on an upper surface thereof; and
a conductive chip via electrically connecting the first external terminal and the second external terminal.

41. A system comprising:
a semiconductor device, comprising:
an insulating body;
a semiconductor chip having an active surface and a back surface opposite the active surface, the semiconductor chip disposed within the insulating body, the active surface exposed by the insulating body, the back surface located within the insulating body;
a post disposed within the insulating body and adjacent to a side of the semiconductor chip, the post having a top surface, a bottom surface and a side surface connecting the top surface and the bottom surface, wherein the bottom surface is located at a level between a level of the active surface and a level of the back surface opposite the active surface; and
a first conductive pattern disposed on the insulating body and on the top surface of the post exposed by the insulating body, the first conductive pattern electrically connected to the semiconductor chip; and a controller in electrical communication with the semiconductor device.

42. The system of claim 41, wherein the system is a multimedia card or a secure digital card.

43. A system comprising:
a semiconductor device, comprising:
an insulating body;
a semiconductor chip having an active surface and a back surface opposite the active surface, the semiconductor chip disposed within the insulating body, the active surface exposed by the insulating body;
a post disposed within the insulating body and adjacent to a side of the semiconductor chip, the post having a top surface, a bottom surface and a side surface connecting the top surface and the bottom surface; and
a conductive pattern disposed on the insulating body and on the top surface of the post exposed by the insulating body, the conductive pattern electrically connected to the semiconductor chip,
wherein the bottom surface of the post is not connected to any circuitry;

a microprocessor; and
an input/out device electrically coupled to the microprocessor and the semiconductor device.

44. The system of claim 43, wherein the semiconductor device is a DRAM, a PRAM, an MRAM, or a nonvolatile memory.

45. A semiconductor device, comprising:
a first insulating body;
a first semiconductor chip having a first active surface and a first back surface opposite the first active surface, the first semiconductor chip disposed within the first insulating body, the first active surface exposed by the first insulating body, the first back surface located within the first insulating body; and
a post disposed within the first insulating body and adjacent to a side of the first semiconductor chip, the post having a top surface, a bottom surface and a side surface connecting the top surface and the bottom surface,
wherein the top surface of the post is located at the same level as the first active surface of the semiconductor chip.

46. The semiconductor device of claim 45, wherein the bottom surface of the post is not connected to any circuitry.

\* \* \* \* \*